(12) United States Patent
Hosokawa et al.

(10) Patent No.: US 10,256,375 B2
(45) Date of Patent: Apr. 9, 2019

(54) LIGHT EMITTING DEVICE

(71) Applicant: NICHIA CORPORATION, Anan-shi, Tokushima (JP)

(72) Inventors: Shoji Hosokawa, Tokushima (JP); Kazuya Nishimata, Anan (JP); Tomokazu Yoshida, Anan (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

(21) Appl. No.: 15/715,841

(22) Filed: Sep. 26, 2017

(65) Prior Publication Data

US 2018/0090647 A1 Mar. 29, 2018

(30) Foreign Application Priority Data

Sep. 29, 2016 (JP) .................... 2016-191374

(51) Int. Cl.
  *H01L 33/50* (2010.01)
  *G02F 1/1335* (2006.01)
(52) U.S. Cl.
  CPC ...... *H01L 33/504* (2013.01); *G02F 1/133603* (2013.01)
(58) Field of Classification Search
  CPC ................ H01L 33/504; G02F 1/133603
  USPC ........................................... 257/98
  See application file for complete search history.

(56) References Cited

U.S. PATENT DOCUMENTS 6,252,254 B1  6/2001  Soules et al.
6,466,135 B1 * 10/2002  Srivastava ......... C09K 11/7734
                                                  257/89
9,719,660 B1 *  8/2017  Petluri ............... C09K 11/7721
2004/0007961 A1 *  1/2004  Srivastava ......... C09K 11/7734
                                                  313/486
2005/0253114 A1 * 11/2005  Setlur ................ C09K 11/68
                                                  252/301.4 R (Continued)

FOREIGN PATENT DOCUMENTS

JP  2002531956 A  9/2002
JP  2008303331 A  12/2008

OTHER PUBLICATIONS

Shinji Okamoo, et al. "Photoluminescence Properties of BaMgAl10O17 Doped with High Concentration of Mn 2+ for Blue-LED-Based Solid-State Lighting", Journal of the Electrochemical Society, 2011, 158(11), J363-J367.

*Primary Examiner* — Igwe U Anya
(74) *Attorney, Agent, or Firm* — Hunton Andrews Kurth LLP

(57) ABSTRACT

Provided is a light emitting device capable of realizing color reproducibility in a broad range. The light emitting device contains a light emitting element having an emission peak wavelength in a range of 430 nm or more and 470 nm or less, a first fluorescent material having a composition represented by formula (I), which has an emission peak wavelength in a range of 510 nm or more and 525 nm or less and has an average particle diameter that is 10.0 μm or more and 30.0 μm or less, and a second fluorescent material having an emission peak wavelength in a range of 620 nm or more and 670 nm or less:

$$X1_a Mg_b Mn_c Al_d O_{a+b+c+1.5d} \quad (I)$$

wherein X1 represents at least one element selected from the group consisting of Ba, Sr and Ca, and a, b, c and d satisfy $0.5 \leq a \leq 1.0$, $0.0 \leq b \leq 0.7$, $0.3 \leq c \leq 0.7$, and $8.5 \leq d \leq 13.0$.

8 Claims, 4 Drawing Sheets

(56) References Cited

U.S. PATENT DOCUMENTS

| | | | |
|---|---|---|---|
| 2010/0132789 A1* | 6/2010 | Huang | C09K 11/0883 136/256 |
| 2013/0140978 A1* | 6/2013 | Beers | H01J 61/72 313/487 |
| 2014/0111082 A1* | 4/2014 | Cohen | C09K 11/7734 313/486 |
| 2017/0170370 A1* | 6/2017 | Park | H01L 33/504 |

* cited by examiner

LIGHT EMITTING DEVICE

CROSS-REFERENCE TO RELATED PATENT APPLICATION

The present application claims priority under 35 U. S. C. § 119 to Japanese Patent Application No. 2016-191374, filed Sep. 29, 2016, the disclosure of which is hereby incorporated by reference in its entirety.

TECHNICAL FIELD

The present disclosure relates to a light emitting device.

DESCRIPTION OF RELATED ART

A light emitting device capable of emitting whitish mixed light has been developed, in which a light emitting diode (LED) to emit blue light is combined with a fluorescent material to be excited by the blue light to emit green color and a fluorescent material to emit red color. In the case where a light emitting device is used as an image display device such as a liquid-crystal display device, a light emitting device capable of realizing a large light flux to reproduce colors in a broad range is desired.

For evaluating a color reproducibility range, for example, an NTSC ratio may be employed, which indicates a television color space standardized in NTSC (National Television System Committee). The NTSC ratio is described. As the chromaticity (x, y) on the xy chromaticity coordinate prescribed in CIE (Commission international de l'eclarirage) 1931, the triangle drawn by connecting red (x=0.67, y=0.33), green (x=0.21, y=0.71), blue (x=0.41, y=0.08) is used as the base, and the triangle drawn by connecting red, green and blue in an image display device is compared with the base triangle to evaluate the color reproducibility as the resultant areal ratio.

As a light emitting device for use as a liquid-crystal display device required to have a color reproducibility of 95% or more as the NTSC ratio, for example, Japanese Unexamined Patent Publication No. 2008-303331 discloses a light emitting device which is provided with a light emitting element having an emission peak wavelength in a range of 390 nm or more and 550 nm or less, a green-emitting β-sialon fluorescent material, and a red-emitting fluorescent material represented by CaAlSiN$_3$:Eu.

SUMMARY

A liquid-crystal display device is provided with color filters each individually transmitting red light, green light and blue light, and transmits a part of the light from a light emitting device to display an image of a combination of three primary colors of red, green and blue. Here, when the light from the light emitting device has an emission spectrum whose half value width is narrow in each wavelength region of red, green and blue, the color reproducibility is good. In particular, the wavelength region of green light is sandwiched between wavelength regions of red light and blue light, and therefore when a light source having an emission peak whose full-width at half-maximum is narrow in a wavelength region of 520 nm or more and 525 nm or less that has an influence on the color purity of green light is used, the influence between the wavelength regions of red light and blue light and the wavelength region of green light could be reduced, and therefore a liquid-crystal display device excellent in color reproducibility can be constructed.

Regarding the β-sialon fluorescent material used in the light emitting device described in Japanese Unexamined Patent Publication No. 2008-303331, the full-width at half-maximum of the emission spectrum thereof is relatively broad, and the emission peak wavelength is on the long wavelength side than the above-mentioned wavelength range, that is, the emission color is closer to yellowish green than green. Consequently, it is difficult to use the light emission device using a β-sialon fluorescent material as a light source for a high-definition liquid-crystal display device that is required to have a broader range of color reproducibility.

Accordingly, an embodiment of the present disclosure is to provide a light emitting device capable of realizing color reproducibility in a broader range when used in a liquid-crystal display device.

The means for solving the above-mentioned problems is as described below, and the present disclosure includes the following aspects.

A first embodiment of the present disclosure is a light emitting device including: a light emitting element having an emission peak wavelength in a range of 430 nm or more and 470 nm or less, a first fluorescent material having a composition represented by the following formula (I), which has an emission peak wavelength in a range of 510 nm or more and 525 nm or less and has an average particle diameter in a range of 10.0 μm or more and 30.0 μm or less, and a second fluorescent material having an emission peak wavelength in a range of 620 nm or more and 670 nm or less:

$$X1_aMg_bMn_cAl_dO_{a+b+c+1.5d} \qquad (I)$$

wherein X1 represents at least one element selected from the group consisting of Ba, Sr and Ca, a, b, c and d each are numbers satisfying 0.5≤a≤1.0, 0.0≤b≤0.7, 0.3≤c≤0.7, and 8.5≤d≤13.0.

According to embodiments of the present disclosure, there can be provided a light emitting device capable of realizing color reproducibility in a broad range when used in a liquid-crystal display device.

DETAILED DESCRIPTION

Embodiments of the light emitting device of the present disclosure are described hereinunder. However, the embodiments given below are exemplification for embodying the technical idea of the present disclosure, and the present invention is not limited to the following light emitting devices. The relationship between the name of color and the chromaticity coordinate, and the relationship between the wavelength range of light and the color name of monochromatic color shall follow JIS Z8110. Unless otherwise specifically indicated, the content of each component in a composition means, in the case where plural kinds of substances corresponding to each component exist in the composition, the total amount of the plural substances existing in the composition.

Light Emitting Device

The light emitting device of one aspect of the present disclosure is a light emitting device including a light emitting element having an emission peak wavelength in a range of 430 nm or more and 470 nm or less, a first fluorescent material having a composition represented by the following compositional formula (I), which has an emission peak wavelength in a range of 510 nm or more and 525 nm or less and has an average particle diameter in a range of 10.0 μm or more and 30.0 μm or less, and a second fluorescent material having an emission peak wavelength in a range of 620 nm or more and 670 nm or less:

$$X1_a Mg_b Mn_c Al_d O_{a+b+c+1.5d} \quad (I)$$

wherein X1 represents at least one element selected from the group consisting of Ba, Sr and Ca, a, b, c and d each are numbers satisfying $0.5 \le a \le 1.0$, $0.0 \le b \le 0.7$, $0.3 \le c \le 0.7$, and $8.5 \le d \le 13.0$.

Accordingly, the emission components for a blue-green region and a yellow green region in an emission spectrum each could be a predetermined amount or less. Namely, regarding the emission spectrum of the light emitting device, the light emitting device can realize an emission spectrum that accentuates emission of each color in a wavelength region of blue, green and red, and therefore, when used in a liquid-crystal display device, the device can enlarge the range of color reproducibility.

A liquid-crystal display device using a conventional light emitting device could hardly show a triangle on the CIE chromaticity coordinate that satisfies an NTSC ratio of accurately 100%, but on the contrary, the liquid-crystal display device using the light emitting device of this aspect can enlarge the range of color reproducibility to more than 100% as the NTSC ratio.

Figure 1:
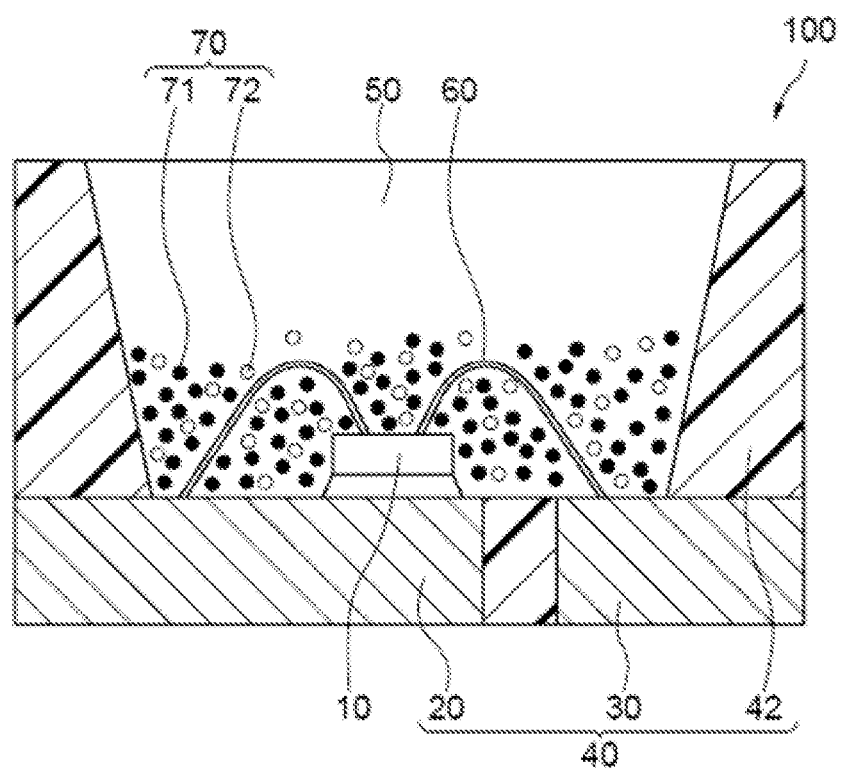
FIG. 1 is a schematic cross-sectional view showing an example of a light emitting device according to an embodiment of the present disclosure.

One example of the light emitting device of this embodiment is described in detail with reference to the drawings attached hereto. FIG. 1 is a schematic cross-sectional view showing a light emitting device 100 of this aspect.

The light emitting device 100 is provided with a molded article 40, a light emitting element 10 and a fluorescent member 50. The molded article 40 includes a first lead 20 and a second lead 30, and a resin part 42 containing a thermoplastic resin or a thermosetting resin, and these are integrally molded. The molded article 40 has a recessed part, and the light emitting element 10 is mounted on the bottom of the recessed part. The light emitting element 10 has a pair of positive and negative electrodes, and the pair of positive and negative electrodes each are electrically connected to the first lead 20 and the second lead 30 via a wire 60. The light emitting element 10 is covered with the fluorescent member 50. The fluorescent member 50 contains, for example, a fluorescent material 70 that converts the wavelength of the light form the light emitting element 10, and a resin. Further, the fluorescent material 70 contains a first fluorescent material 71 and a second fluorescent material 72. Regarding the first lead 20 and the second lead 30 each connected to the pair of positive and negative electrodes of the light emitting element 10, the first lead 20 and the second lead 30 are partly exposed out from the resin part 42 toward the outside of the package to constitute the light emitting device 100. Via these first lead 20 and second lead 30, the light emitting device 100 receives external power for light emission.

The first fluorescent material 71 and the second fluorescent material 72 (hereinafter these two may be referred to simply as "fluorescent material 70" as combined) may constitute, along with a sealant material, the fluorescent member 50 to cover the light emitting element. Preferred examples of the sealant material to constitute the fluorescent member 50 include a silicone resin, an epoxy resin, etc. The fluorescent member 50 is filled in the recessed part of the light emitting device 100 to cover the light emitting element 10 therein.

The total content of the fluorescent material 70 in the fluorescent member 50 may be, for example, 50 parts by mass to 300 parts by mass relative to the resin (100 parts by mass), and is preferably 50.5 parts by mass or more and 250 parts by mass or less, more preferably 51 parts by mass or more and 230 parts by mass or less. When the total content of the fluorescent material in the fluorescent member 50 is within the above range, the wavelength of the light emitted by the light emitting element 10 can be efficiently converted by the fluorescent material 70.

The fluorescent member 50 may contain, in addition to the sealant material resin and the fluorescent material 70, a filler, a light diffusing agent, etc. For example, when the member contains a light diffusing agent, the directionality from the light emitting element 10 can be relaxed and the viewing angle can be increased. Examples of the filler include silica, titanium oxide, zinc oxide, zirconium oxide, alumina, etc. In the case where the fluorescent member 50 contains a filler, the filler content may be, for example, 1 part by mass or more and 20 parts by mass or less relative to the resin (100 parts by mass).

The fluorescent member 50 functions not only as a wavelength conversion member containing the fluorescent material 70 but also as a member for protecting the light emitting element 10, the first fluorescent material 71 and the second fluorescent material 72 from external environments.

In FIG. 1, as one example of the light emitting device 100 of this aspect, the first fluorescent material 71 and the second fluorescent material 72 exist eccentrically around the light emitting element 10. Namely, in the fluorescent member 50, the first fluorescent material 71 and the second fluorescent material 72 are arranged more in a portion of the fluorescent member 50 close to the first lead 20 and the second lead 30 on which the light emitting element 10 is mounted to constitute the bottom of the recessed part of the light emitting device 100 than in a portion of the fluorescent member 50 close to the vicinity of the top surface of the molded article 40. In that manner, the first fluorescent material 71 and the second fluorescent material 72 are arranged to be adjacent to the light emitting element 10, so that the wavelength of the light from the light emitting element 10 can be efficiently converted and the light emitting device of the type can have excellent light emission efficiency. Regarding the arrangement position of the first fluorescent material 71 and the second fluorescent material 72 in the fluorescent member 50, they may be arranged close to the light emitting element 10, but not limited thereto. For example, the first fluorescent material 71 and the second fluorescent material 72 may be arranged as spaced from the light emitting element 10 in the fluorescent member 50 in order to reduce the influence of heat from the light emitting element 10 on the first fluorescent material 71 and the second fluorescent material 72. For inhibiting color unevenness of light from the light emitting device 100, the first fluorescent material 71 and the second fluorescent material 72 may be nearly uniformly dispersed entirely in the fluorescent member 50.

In the light emitting device 100 shown in FIG. 1, the first fluorescent material 71 and the second fluorescent material 72 are arranged around the light emitting element 10 in a state where the first fluorescent material 71 and the second fluorescent material 72 are mixed therearound.

Figure 2:
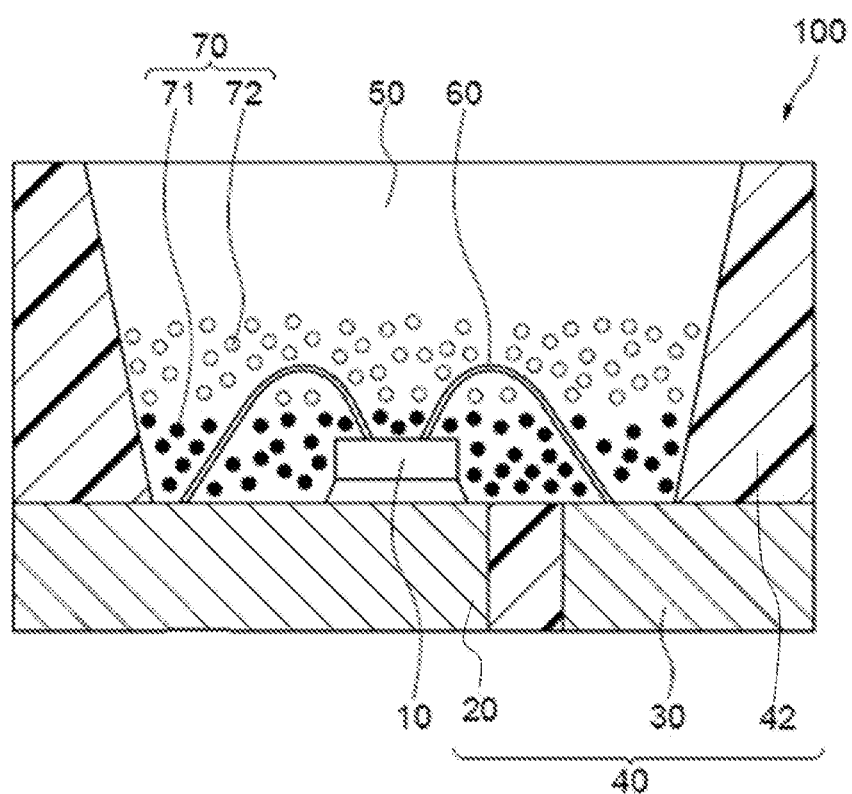
FIG. 2 is a schematic cross-sectional view showing another example of a light emitting device according to an embodiment of the present disclosure.

FIG. 2 shows another example of the light emitting device 100 of this aspect, where in the fluorescent member 50, the first fluorescent material 71 is arranged around the light emitting element 10 and the second fluorescent material 72 is above the first fluorescent material 71, that is, in the site closer to the outer side of the light emitting device 100. Accordingly, the first fluorescent material 71 can be efficiently excited for light emission by the light emitted by the light emitting element 10. On the other hand, in the fluorescent member 50 where the second fluorescent material 72 is arranged in the vicinity of the light emitting element 10 and the first fluorescent material 71 is arranged above it, the excitation of the first fluorescent material arranged on the upper side is prevented by the second fluorescent material and, as a result, the first fluorescent material could hardly provide light emission.

Light Emitting Element

The light emitting element 10 emits light that has an emission spectrum on the short wavelength side of visible light (for example, in a range of 380 nm or more and 485 nm or less), and the emission peak wavelength thereof is within a range of 430 nm or more and 470 nm or less, more preferably within a range of 440 nm or more and 460 nm or less. Using the light emitting element that has an emission peak range in the wavelength range as an excitation light source, there can be provided a light emitting device capable of emitting mixed light of the light from the light emitting element and the fluorescent light from the first fluorescent material and the second fluorescent material.

The light emitting element is preferably a semiconductor light emitting element using a gallium nitride semiconductor ($In_XAl_YGa_{1-X-Y}N$, $0 \leq X$, $0 \leq Y$, $X+Y \leq 1$). Using the semiconductor light emitting element, there can be provided a stable light emitting device having high efficiency and high linearity of output relative to input, and strong against mechanical impact. The half value width of the emission spectrum of the light emitting element may be, for example, 30 nm or less.

Fluorescent Material

The fluorescent material 70 absorbs at least a part of the light emitted by the light emitting element 10, and converts the wavelength thereof into a wavelength that differs from the wavelength of the light emitted by the light emitting element 10. In the fluorescent material 70, preferably, the first fluorescent material 71 emits a green color and the second fluorescent material 72 emits a red color.

First Fluorescent Material

The light emitting device 100 contains the first fluorescent material 71 having a composition represented by the following formula (I), which has an emission peak wavelength in a range of 510 nm or more and 525 nm or less and has an average particle diameter in a range of 10.0 μm or more and 30.0 μm or less (hereinafter this may be referred to as "first fluorescent material (I)"):

$$X1_aMg_bMn_cAl_dO_{a+b+c+1.5d} \quad \text{(I)}$$

wherein X1 represents at least one element selected from the group consisting of Ba, Sr and Ca, a, b, c and d each are numbers satisfying $0.5 \leq a \leq 1.0$, $0.0 \leq b \leq 0.7$, $0.3 \leq c \leq 0.7$, and $8.5 \leq d \leq 13.0$.

Regarding the first fluorescent material (I) contained in the light emitting device 100, X1 in formula (I) thereof preferably contains Ba. Containing Ba, the first fluorescent material (I) can relatively lower the reflection ratio and can increase the emission intensity.

In formula (I), the subscript a indicates the total molar compositional ratio of at least one element selected from the group consisting of Ba, Sr and Ca. In the first fluorescent material having the composition represented by formula (I), when a does not satisfy $0.5 \leq a \leq 1.0$, the crystal structure of the first fluorescent material (I) may be unstable and the emission intensity may lower. The subscript a is preferably a number satisfying $0.6 \leq a \leq 1.0$, more preferably $0.8 \leq a \leq 1.0$. The subscript a may be 0.99 or less.

In formula (I), the subscript b is a molar compositional ratio of Mg. When the subscript b is not a number satisfying $0.0 \leq b \leq 0.7$, the molar compositional ratio of Mg is high and the amount of Mn to be an activator element becomes relatively small, and therefore the relative emission intensity lowers. The subscript b is preferably a number satisfying $0.05 \leq b \leq 0.65$, more preferably $0.10 \leq b \leq 0.60$. In formula (I), when the subscript b is a number satisfying $0.0 \leq b \leq 0.7$, the light emitting device can have the first fluorescent material (I) such that the emission spectrum in excitation in the range of near ultraviolet to blue thereof can have an emission peak wavelength in a range of 510 nm or more and 525 nm or less, the reflection ratio thereof is relatively low and the relative emission intensity thereof is large. In the case where the light emitting device is used in a liquid-crystal display device, broad color reproducibility to a degree of an NTSC ratio of more than 100% can be realized.

In formula (I), the subscript c is a molar compositional ratio of Mn, and Mn is an activator element of the first fluorescent material (I). As the activator, the fluorescent material may contain Eu and Ce in addition to Mn. In formula (I), when the subscript c is not a number satisfying $0.3 \leq c \leq 0.7$, for example, where the material is excited with light in a region of near ultraviolet to blue, the reflection ratio thereof may increase and the relative emission intensity may lower. In formula (I), when the subscript c is less than 0.3, the activation amount of Mn is small, and in the case where the first fluorescent material (I) is excited by light in a region of near ultraviolet to blue, the light absorption is small and the reflection ratio is high, and therefore the relative emission intensity could not be large. In formula (I), when the subscript c is more than 0.7, the activation amount of Mn is too much and the first fluorescent material (I) may undergo concentration quenching and the relative emission intensity thereof may be therefore low.

In formula (I), the subscript c is preferably a number satisfying $0.40 \leq c \leq 0.65$, more preferably $0.40 \leq c \leq 0.60$, even more preferably $0.45 \leq c \leq 0.60$.

In formula (I), the subscript d is a molar compositional ratio of Al. In the case where the subscript d is not a number satisfying $8.5 \leq d \leq 13.0$, the crystal structure becomes unstable, and in the case where the first fluorescent material (I) is excited by light in a region of near ultraviolet to blue, the relative emission intensity may lower.

In formula (I), the subscript d is preferably a number satisfying $9.0 \leq d \leq 13.0$, more preferably $9.0 \leq d \leq 12.0$, even more preferably $9.0 \leq d \leq 11.0$.

The first fluorescent material (I) may be produced using a flux such as a halide for increasing the reactivity thereof as a raw material. In this case, when a flux containing an alkali metal is used, a minor amount of an alkali metal element may be detected from the fluorescent material. Even in such a case, the material corresponds to the first fluorescent material (I) so far as the main component thereof satisfies formula (I). The content of the alkali metal element contained in the first fluorescent material (I) is preferably 1000 ppm or less, more preferably 990 ppm or less, and is preferably 100 ppm or more, more preferably 200 ppm or more, even more preferably 300 ppm or more. In the case where the first fluorescent material (I) contains an alkali metal element, the molar compositional ratio of the alkali metal element in the first fluorescent material (I) is preferably 0.05 mol or less, more preferably 0.04 mol or less. In the case where the first fluorescent material (I) contains a halogen element, the molar compositional ratio of the halogen element in the first fluorescent material (I) is preferably 0.12 mol or less, more preferably 0.1 mol or less.

As the flux, alkali metal fluorides, alkali metal chlorides and the like can be used. The flux is preferably sodium fluoride (NaF) or potassium fluoride (KF), more preferably NaF.

The first fluorescent material (I) absorbs the light that is emitted by the light emitting element 10 and has an emission peak wavelength falling within a range of 430 nm or more and 470 nm or less, and the material has an emission peak wavelength in a range of 510 nm or more and 525 nm or less. Regarding the first fluorescent material (I), the full-width at half-maximum of the emission spectrum thereof excited by the light emitted by the light emitting element having an emission peak wavelength of, for example, 450 nm is preferably 45 nm or less, more preferably 40 nm or less, even more preferably 35 nm or less, still more preferably 30 nm or less.

When excited with the light emitting element having an emission peak wavelength in a range of 430 nm or more and 470 nm or less, the first fluorescent material (I) has an emission spectrum of green having a narrow full-width at half-maximum, and therefore in the case where the light emitting device using the first fluorescent material (I) is used in a liquid-crystal display device, the color reproducibility of the device can be broadened.

The first fluorescent material (I) preferably has a reflection ratio of light at 450 nm of 84% or less. The reflection ratio of light at 450 nm of the first fluorescent material (I) is more preferably 83% or less, even more preferably 82% or less, still more preferably 81% or less, especially preferably 80% or less. When the reflection ratio of light at 450 nm of the first fluorescent material (I) contained in the light emitting device of this aspect is 84% or less, light absorption can be increased more than in the case where the reflection ratio is more than 84%, and therefore the emission intensity of the first fluorescent material (I) can be increased, and the light flux of the light emitting device provided with the first fluorescent material (I) can be thereby increased. The reflection ratio of the first fluorescent material may be determined by measuring the reflected light relative to the light having a specific wavelength, using a spectrofluorometer.

The first fluorescent material (I) has an average particle diameter in a range of 10.0 µm or more and 30.0 µm or less. When the average particle diameter of the first fluorescent material (I) is less than 10.0 µm, light absorption by the first fluorescent material (I) lowers and the emission intensity of the first fluorescent material (I) could not be increased. On the other hand, when the first fluorescent material (I) has an average particle diameter that is more than 30.0 µm, increased color unevenness of the light emitting device may result.

The average particle diameter of the first fluorescent material (I) is preferably in a range of 10.5 µm or more and 29.0 µm or less, more preferably in a range of 11.0 µm or more and 28.5 µm or less, even more preferably in a range of 12.0 µm or more and 28.0 µm or less.

In this description, the average particle diameter of the fluorescent material is a volume-average particle size (median diameter) that reaches 50% volume cumulative frequency from the small particle size side measured with a laser diffractometric particle sizer (for example, MASTER SIZER 3000 manufactured by Malvern Instruments Ltd.).

As the green light emitting material to be arranged in the light emitting device of this embodiment, it is not always necessary to use the first fluorescent material alone having the composition represented by formula (I) but the device may further contain any other green emitting fluorescent material.

In the light emitting device of this embodiment, from the viewpoint of realizing desired color reproducibility, it is preferable that the green emitting fluorescent material is contained in the fluorescent member 50 in an amount in a range of 50 parts by mass or more and 250 parts by mass or less relative to 100 parts by mass of the resin therein, more preferably in a range of 60 parts by mass or more and 220 parts by mass or less, and even more preferably in a range of 70 parts by mass or more and 200 parts by mass or less.

The ratio of the green emitting fluorescent material containing the first fluorescent material having the composition represented by formula (I) (hereinafter this may be referred to as "green fluorescent material") to the red emitting fluorescent material containing the second fluorescent material having an emission peak wavelength in a range of 620 nm or more and 670 nm or less (hereinafter this may be referred to as "red fluorescent material") (green fluorescent material/red fluorescent material) is preferably in a range of 5/95 or more and 99/1 or less. The ratio of the green fluorescent material to the red fluorescent material (green fluorescent material/red fluorescent material) is more preferably in a range of 20/80 or more and 98/2 or less, even more preferably in a range of 30/70 or more and 97/3 or less, still more preferably in a range of 40/60 or more and 96/4 or less, and especially preferably in a range of 50/50 or more and 95/5 or less.

When the fluorescent material 50 contains the green fluorescent material containing the first fluorescent material (I) and the red fluorescent material containing the second fluorescent material 72 whose emission peak wavelength falls in a range of 630 nm or more and 670 nm or less, in the ratio falling within the range, the range of color reproducibility can be enlarged.

Second Fluorescent Material

The light emitting device 100 contains the second fluorescent material 72 having an emission peak wavelength in a range of 620 nm or more and 670 nm or less.

As the second fluorescent material, one kind of fluorescent material may be used singly or two or more kinds thereof may be used as combined so far as the emission peak wavelength thereof falls in a range of 620 nm or more and 670 nm or less.

The second fluorescent material 72 is preferably at least one selected from the group consisting of a fluoride fluorescent material, a magnesium fluorogermanate fluorescent material, a nitride fluorescent material and a sulfide fluorescent material. When the second fluorescent material 72 is at least one selected from those kinds of fluorescent materials, the range of color reproducibility of the light emitting device can be enlarged.

The second fluorescent material 72 is preferably at least one selected from the group consisting of fluorescent materials having compositions represented by the following formulae (IIa) to (IIe). When the second fluorescent material 72 contains at least one selected from the group consisting of the fluorescent materials having compositions represented by the following formulae (IIa) to (IIe), the range of color reproducibility of the light emitting device can be enlarged.

$$K_2(Si,Ge,Ti)F_6:Mn \tag{IIa}$$

$$3.5MgO \cdot 0.5MgF_2 \cdot GeO_2:Mn \tag{IIb}$$

$$(Sr,Ca)AlSiN_3:Eu \tag{IIc}$$

$$(Sr,Ca)LiAl_3N_4:Eu \tag{IId}$$

$$(Ca,Sr)S:Eu \tag{IIe}$$

The second fluorescent material 72 absorbs the light emitted by the light emitting element 10 having an emission peak wavelength in a range of 430 nm or more and 470 nm or more, and has an emission peak wavelength in a range of 620 nm or more and 670 nm or less. Regarding the second fluorescent material 72, for example, the full-width at half-maximum of the emission spectrum thereof excited by the light emitted by the light emitting device 10 having an emission peak wavelength of 450 nm is preferably 100 nm or less, more preferably 80 nm or less, even more preferably 70 nm or less, still more preferably 65 nm or less.

The average particle diameter of the second fluorescent material 72 is, from the viewpoint of emission efficiency, preferably in a range of 2.0 μm or more and 50 μm or less, more preferably in a range of 5.0 μm or more and 45.0 μm or less, even more preferably in a range of 7.0 μm or more and 42.0 μm or less.

In the light emitting device 100, from the viewpoint of obtaining desired color reproducibility, the red emitting second fluorescent material 72 is contained in the fluorescent member 50 in an amount in a range of 0.5 parts by mass or more and 100 parts by mass or less relative to 100 parts by mass of the resin therein, more preferably in a range of 1 part by mass or more and 90 parts by mass or less, even more preferably in a range of 3 parts by mass or more and 80 parts by mass or less.

When the maximum emission intensity in a range of 510 nm or more and 525 nm or less in the emission spectrum of the light emitting device of this embodiment is referred to as 100%, it is preferable that the relative emission intensity at 500 nm of the light emitting device is 30% or less, the relative emission intensity at 520 nm is 85% or more, and the relative emission intensity at 540 nm is 75% or less. More preferably, the relative emission intensity at 500 nm is 25% or less, the relative emission intensity at 520 nm is 90% or more, and the relative emission intensity at 540 nm is 60% or less.

When the relative emission intensity falls within the above range, blue, green and red emission can be accentuated in the wavelength ranges of blue light and red light and in the wavelength range of green that is sandwiched between the former two and has significant influence on color reproducibility, in the emission spectrum of the light emitting device, and consequently, the color reproducibility range of a liquid-crystal display device can be thereby enlarged.

The light emitting device of this embodiment emits a mixed light of the light of the light emitting element and the light emitted by the first fluorescent material and the second fluorescent material, and the chromaticity of the mixed light is preferably within a range of x 0.22 or more and 0.34 or less and y 0.16 or more and 0.34 or less in the xy chromaticity coordinate prescribed in CIE 1931, more preferably within a range of x 0.22 or more and 0.33 or less and y 0.17 or more and 0.33 or less.

Other Fluorescent Materials

The fluorescent member 50 may contain, as needed, an additional fluorescent material other than the first fluorescent material (I) and the second fluorescent material 72. Examples of the other fluorescent material include (Y,Gd,Tb,Lu)$_3$(Al,Ga)$_5$O$_{12}$:Ce, Ca$_3$Sc$_2$Si$_3$O$_{12}$:Ce, CaSc$_2$O$_4$:Ce, (La,Y)$_3$Si$_6$N$_{11}$:Ce, (Ca,Sr,Ba)$_3$Si$_6$O$_9$N$_4$:Eu, (Ca,Sr,Ba)$_3$Si$_6$O$_{12}$N$_2$:Eu, (Ba,Sr,Ca)Si$_2$O$_2$N$_2$:Eu, (Ba,Sr,Ca)$_2$SiO$_4$:Eu, (Ba,Sr,Ca)Ga$_2$S$_4$:Eu, etc. In the case where the light emitting device contains an additional fluorescent material, the content thereof may be adequately selected in accordance with the intended purpose, and for example, the content of the other fluorescent material is preferably 5% by mass or less relative to the total amount of the first fluorescent material and the second fluorescent material, more preferably 2% by mass or less.

EXAMPLES

The present invention will now be described in detail with reference to examples, but the present invention is not limited to these examples.

Fluorescent Material

Prior to production of light emitting devices of Examples and Comparative Examples, green emitting fluorescent materials and red emitting fluorescent materials were prepared.

As the green emitting fluorescent materials, first fluorescent materials (I) and other fluorescent materials were prepared. As the first fluorescent materials (I), fluorescent materials A-1 to A-5, and as the other green emitting fluorescent materials, fluorescent materials A-6 to A-10, fluorescent material B, fluorescent material C and fluorescent material D were prepared, as shown in Table 1.

Fluorescent Material A-1

The fluorescent material A-1 is a fluorescent material having a composition represented by the $X1_aMg_bMn_cAl_dO_{a+b+c+1.5d}$ where X1 is Ba, and where the molar compositional ratio was so defined that the subscript a could be 1.0, the subscript b could be 0.5, the subscript c could be 0.5 and the subscript d could be 10.0. Specifically, for the fluorescent material A-1, the molar ratio of the raw materials was so defined that the compositional formula thereof could be represented by Ba$_{1.0}$Mg$_{0.5}$Mn$_{0.5}$Al$_{10}$O$_{17}$. BaCO$_3$, MgO, MnCO$_3$, Al$_2$O$_3$, and MgF$_2$ were used as raw materials, and NaF was used as a flux. These raw materials were metered and mixed so that the molar ratio of BaCaO$_3$:MgO:MgF$_2$:MnCO$_3$:Al$_2$O$_3$NaF could be 1.0:0.4:0.1:0.5:10.0:0.1 to prepare a mixture. The mixture was charged in an alumina crucible, and heat-treated at 1500° C. for 5 hours in a mixed gas atmosphere of H$_2$/N$_2$=3/97 (by volume).

Using a horizontal multipurpose X-ray diffractometer (product name: Ultima IV, manufactured by Rigaku Corporation) with a CuKα ray, the resultant powder was analyzed through X-ray diffractometry (XRD). The X-ray diffractometric spectrum of the powder was compared with the X-ray diffractometric pattern measured with a CuKα ray of BaMgAl$_{10}$O$_{17}$ shown in the ICDD data No. 00-026-0163 in International Center for Diffraction, thereby confirming whether or not a peak was given at the same angle (2θ value), and from this, it was confirmed that the resultant powder had the same crystal structure as that of the compound represented by $BaMgAl_{10}O_{17}$. In addition, the powder, florescent material was irradiated with light having an excitation wavelength of 450 nm to measure the emission spectrum thereof at room temperature (25° C.±5° C.), using a quantum efficiency measuring device (QE-2000 manufactured by Otsuka Electronics Co., Ltd.). The wavelength at which the emission intensity of the powder could be the maximum was referred to as the emission peak wavelength (nm). The emission peak wavelength was 517 nm. The powder was referred to as a fluorescent material A-1.

Fluorescent Material A-2

The charge-in quantities of the raw materials were formulated so that the formula of the fluorescent material having the composition to be produced could be represented by $Ba_{1.0}Mg_{0.6}Mn_{0.4}Al_{10}O_{17}$. A fluorescent material A-2 was produced in the same manner as that for the fluorescent material A-1 except that the molar ratio of $MgO:MgF_2:NaF$ of the raw materials could be 0.5:0.1:0.1.

Fluorescent Material A-3

The charge-in quantities of the raw materials were formulated so that the formula of the fluorescent material having the composition to be produced could be represented by $Ba_{1.0}Mg_{0.4}Mn_{0.6}Al_{10}O_{17}$. A fluorescent material A-3 was produced in the same manner as that for the fluorescent material A-1 except that the molar ratio of $MgO:MgF_2:NaF$ of the raw materials could be 0.3:0.1:0.1.

Fluorescent Material A-4

The charge-in quantities of the raw materials were formulated so that the formula of the fluorescent material having the composition to be produced could be represented by $Ba_{1.0}Mg_{0.5}Mn_{0.5}Al_{10}O_{17}$. A fluorescent material A-4 was produced in the same manner as that for the fluorescent material A-1 except that KF was used as a flux and the molar ratio of $BaCO_3:MgO:MgF_2:MnCO_3:Al_2O_3:KF$ of the raw materials could be 1.00:0.40:0.10:0.50:10.00:0.05.

Fluorescent Material A-5

The charge-in quantities of the raw materials were formulated so that the formula of the fluorescent material having the composition to be produced could be represented by $Ba_{1.0}Mn_{0.5}Al_{10}O_{17}$. b in the compositional formula (I) of the fluorescent material to be produced is 0.0. A fluorescent material A-5 was produced in the same manner as that for the fluorescent material A-1 except that $BaCO_3$, $MnCO_3$, $Al_2O_3$, and $AlF_3$ were used as the raw materials, NaF was used as a flux, and the molar ratio of $BaCO_3:MnCO_3:Al_2O_3:AlF_3:NaF$ of the raw materials could be 1.000:0.500:9.933:0.067:0.050.

Fluorescent Material A-6

The charge-in quantities of the raw materials were formulated so that the formula of the fluorescent material having the composition to be produced could be represented by $Ba_{1.0}Mg_{0.8}Mn_{0.2}Al_{10}O_{17}$. A fluorescent material A-6 was produced in the same manner as that for the fluorescent material A-1 except that $BaCO_3$, $MgO$, $MnCO_3$, $Al_2O_3$, and $MgF_2$ were used as the raw materials, NaF was not used as a flux, and the molar ratio of $BaCO_3:MgO:MgF_2:MnCO_3:Al_2O_3$ of the raw materials could be 1.0:0.7:0.1:0.2:10.0.

Fluorescent Material A-7

The charge-in quantities of the raw materials were formulated so that the formula of the fluorescent material having the composition to be produced could be represented by $Ba_{1.0}Mg_{0.6}Mn_{0.4}Al_{10}O_{17}$. A fluorescent material A-7 was produced in the same manner as that for the fluorescent material A-1 except that NaF was not used as a flux, and the molar ratio of $MgO:MgF_2:MnCO_3$ of the raw materials could be 0.5:0.1:0.4.

Fluorescent Material A-8

The charge-in quantities of the raw materials were formulated so that the formula of the fluorescent material having the composition to be produced could be represented by $Ba_{1.0}Mg_{0.5}Mn_{0.5}Al_{10}O_{17}$. A fluorescent material A-8 was produced in the same manner as that for the fluorescent material A-1 except that NaF was not used as a flux, and the molar ratio of $MgO:MgF_2:MnCO_3$ of the raw materials could be 0.4:0.1:0.5.

Fluorescent Material A-9

The charge-in quantities of the raw materials were formulated so that the formula of the fluorescent material having the composition to be produced could be represented by $Ba_{1.0}Mg_{0.9}Mn_{0.1}Al_{10}O_{17}$. A fluorescent material A-9 was produced in the same manner as that for the fluorescent material A-1 except that the molar ratio of $MgO:MgF_2:MnCO_3$ of the raw materials could be 0.8:0.1:0.1.

Fluorescent Material A-10

The charge-in quantities of the raw materials were formulated so that the formula of the fluorescent material having the composition to be produced could be represented by $Ba_{1.0}Mg_{0.8}Mn_{0.2}Al_{10}O_{17}$. A fluorescent material A-10 was produced in the same manner as that for the fluorescent material A-1 except that the molar ratio of $MgO:MgF_2:MnCO_3$ of the raw materials could be 0.7:0.1:0.2.

Fluorescent Material B

A fluorescent material represented by $Si_{6-z}Al_zO_zN_{8-z}$:Eu (where z is 0.12) and having an emission peak wavelength, as measured in the same manner as that for the fluorescent material A-1, of 535 nm was used (hereinafter referred to as "β-sialon fluorescent material").

Fluorescent Material C

A fluorescent material represented by $Ca_8MgSi_4O_{16}C_{12}$:Eu and having an emission peak wavelength, as measured in the same manner as that for the fluorescent material A-1, of 522 nm was used (hereinafter referred to as "chlorosilicate fluorescent material").

Fluorescent Material D

A fluorescent material represented by $SrGa_2S_4$:Eu and having an emission peak wavelength, as measured in the same manner as that for the fluorescent material A-1, of 535 nm was used (hereinafter referred to as "thiogallate fluorescent material").

Second Fluorescent Material

As the second fluorescent material 72, a red-emitting fluorescent material represented by $K_2SiF_6$:Mn and having an emission peak wavelength, as measured in the same manner as that for the fluorescent material A-1, of 631 nm was used (hereinafter referred to as "KSF fluorescent material").

Each fluorescent material was analyzed for the following measurements.

Average Particle Diameter (μm)

Using a laser diffractometric particle sizer (MASTER SIZER 3000 manufactured by Malvern Instruments Ltd.), the volume-average particle size (Dm: median diameter) to reach 50% volume cumulative frequency from the small particle size side of each of the fluorescent materials A-1 to A-10 was measured. The results are shown in Table 1.

Relative Emission Intensity (%)

Using a quantum efficiency measuring device (QE-2000, manufactured by Otsuka Electronics Co., Ltd.), each fluorescent material of A-1 to A-10 was irradiated with light having an excitation wavelength of 450 nm to measure the emission spectrum thereof at room temperature (25° C.±5° C.). The emission intensity at the emission peak wavelength of the resultant emission spectrum was measured, and with the emission intensity of the fluorescent material A-3 set as 100%, the emission intensity of each fluorescent material was expressed as a relative emission intensity (%). The results are shown in Table 1.

Reflection Ratio (%)

Using a spectrofluorometer (F-4500 manufactured by Hitachi High-Technologies Corporation), the reflected light on the fluorescent material A-1 to A-10 to light having an excitation wavelength of 450 nm was measured at room temperature (25° C.±5° C.). As a standard, $CaHPO_4$ was used. The reflection ratio of $CaHPO_4$ was set as 100%, and the reflection ratio (%) of each fluorescent material was expressed as a relative value to the standard. The results are shown in Table 1.

Evaluation of Emission Property

Figure 3:
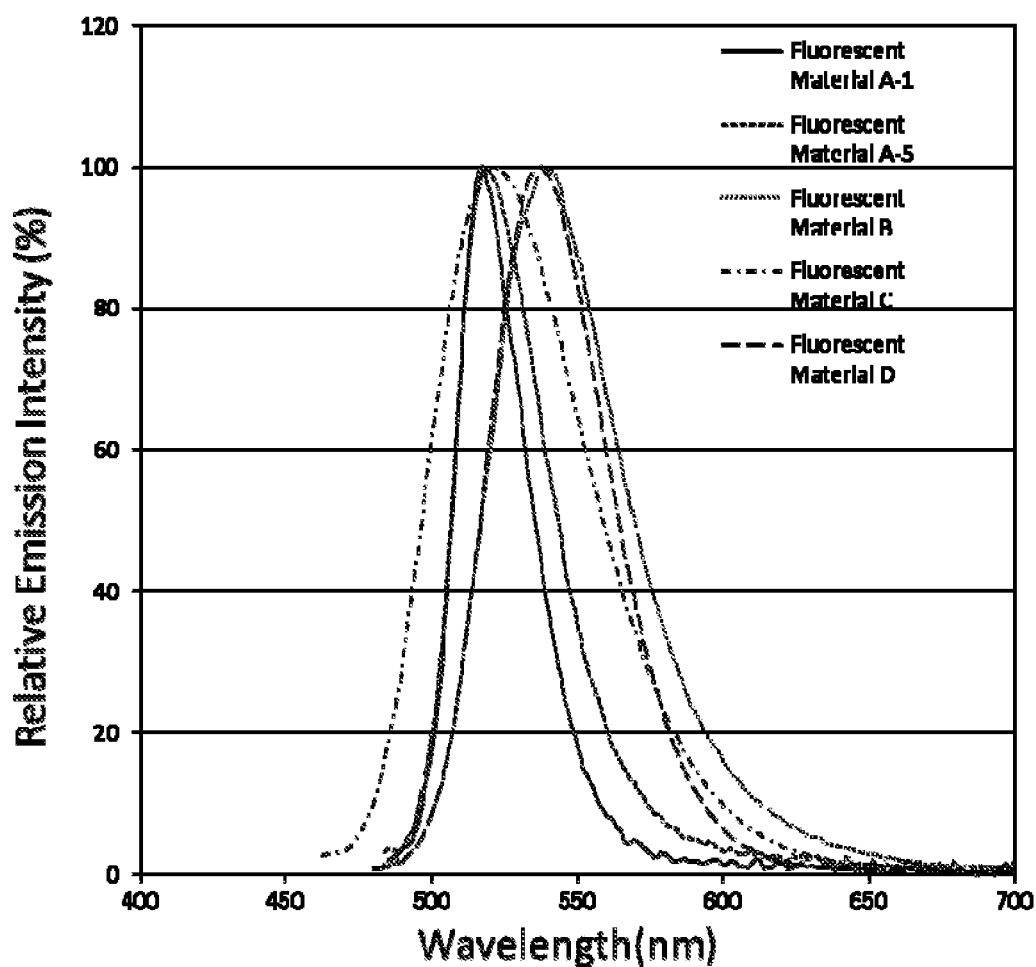
FIG. 3 includes emission spectra each showing the relative emission intensity to a wavelength of the fluorescent material used in the light emitting devices of Examples and Comparative Examples.

The fluorescent materials A-1 to A-10, the fluorescent material B, the fluorescent material C and the fluorescent material D were analyzed in point of the emission property thereof. A half value width of the resultant emission spectrum was calculated. The results are shown in Table 1. The emission spectra of the fluorescent material A-1, the fluorescent material A-5, the fluorescent material B, the fluorescent material C and the fluorescent material D are shown in FIG. 3.

Composition Analysis

The fluorescent materials A-1 to A-10 were analyzed for the composition thereof through ICP emission spectrometry using an inductively coupled plasma emission spectrometer (manufactured by Perkin Elmer Inc.) to measure the molar amount (compositional ratio) of elements of Ba, Mg, Mn, Al, O, Na, K, and F therein. The results are shown in Table 2. The numerical value of the molar amount (compositional ratio) shown in Table 2 is a value calculated from the analytical result based on the molar amount of Al, which was set as 10.00.

TABLE 1

| | Designed Compositional Formula | Average Particle Diameter (Dm) (μm) | Relative Emission Intensity (%) | Reflection Ratio (%) | Full-width at Half-maximum (nm) |
|---|---|---|---|---|---|
| Fluorescent Material A-1 | $Ba_{1.0}Mg_{0.5}Mn_{0.5}Al_{10}O_{17}$ | 15.7 | 154 | 76.9 | 28 |
| Fluorescent Material A-2 | $Ba_{1.0}Mg_{0.6}Mn_{0.4}Al_{10}O_{17}$ | 16.4 | 149 | 81.2 | 28 |
| Fluorescent Material A-3 | $Ba_{1.0}Mg_{0.4}Mn_{0.6}Al_{10}O_{17}$ | 16.7 | 100 | 76.0 | 28 |
| Fluorescent Material A-4 | $Ba_{1.0}Mg_{0.5}Mn_{0.5}Al_{10}O_{17}$ | 21.3 | 166 | 76.4 | 28 |
| Fluorescent Material A-5 | $Ba_{1.0}Mn_{0.5}Al_{10}O_{17}$ | 15.8 | 126 | 76.8 | 37 |
| Fluorescent Material A-6 | $Ba_{1.0}Mg_{0.8}Mn_{0.2}Al_{10}O_{17}$ | 9.6 | 77 | 90.4 | 28 |
| Fluorescent Material A-7 | $Ba_{1.0}Mg_{0.6}Mn_{0.4}Al_{10}O_{17}$ | 9.4 | 104 | 86.7 | 28 |
| Fluorescent Material A-8 | $Ba_{1.0}Mg_{0.5}Mn_{0.5}Al_{10}O_{17}$ | 9.2 | 112 | 84.7 | 29 |
| Fluorescent Material A-9 | $Ba_{1.0}Mg_{0.9}Mn_{0.1}Al_{10}O_{17}$ | 18.3 | 77 | 88.4 | 27 |
| Fluorescent Material A-10 | $Ba_{1.0}Mg_{0.8}Mn_{0.2}Al_{10}O_{17}$ | 17.1 | 110 | 86.1 | 27 |
| Fluorescent Material B | $Si_{6-z}Al_zN_{8-z}$:Eu(z = 0.12) | — | — | — | 52 |
| Fluorescent Material C | $Ca_8MgSi_4O_{16}Cl_2$:Eu | — | — | — | 63 |
| Fluorescent Material D | $SrGa_2S_4$:Eu | — | — | — | 48 |

TABLE 2

| | Designed Compositional Formula | Analyzed Composition (molar amount) | | | | | | | |
|---|---|---|---|---|---|---|---|---|---|
| | | Ba | Mg | Mn | Al | O | Na | K | F |
| Fluorescent Material A-1 | $Ba_{1.0}Mg_{0.5}Mn_{0.5}Al_{10}O_{17}$ | 0.97 | 0.47 | 0.48 | 10.00 | 17.15 | 0.04 | — | 0.07 |
| Fluorescent Material A-2 | $Ba_{1.0}Mg_{0.6}Mn_{0.4}Al_{10}O_{17}$ | 0.98 | 0.59 | 0.38 | 10.00 | 17.03 | 0.04 | — | 0.08 |
| Fluorescent Material A-3 | $Ba_{1.0}Mg_{0.4}Mn_{0.6}Al_{10}O_{17}$ | 0.98 | 0.39 | 0.56 | 10.00 | 17.18 | 0.04 | — | 0.07 |
| Fluorescent Material A-4 | $Ba_{1.0}Mg_{0.5}Mn_{0.5}Al_{10}O_{17}$ | 0.99 | 0.47 | 0.48 | 10.00 | 17.13 | — | 0.01 | 0.06 |
| Fluorescent Material A-5 | $Ba_{1.0}Mn_{0.5}Al_{10}O_{17}$ | 0.92 | 0.00 | 0.48 | 10.00 | 16.95 | 0.04 | — | 0.10 |
| Fluorescent Material A-6 | $Ba_{1.0}Mg_{0.8}Mn_{0.2}Al_{10}O_{17}$ | 0.99 | 0.76 | 0.18 | 10.00 | 17.12 | 0.00 | — | 0.08 |
| Fluorescent Material A-7 | $Ba_{1.0}Mg_{0.6}Mn_{0.4}Al_{10}O_{17}$ | 0.99 | 0.56 | 0.38 | 10.00 | 17.21 | 0.00 | — | 0.09 |

TABLE 2-continued

| | Designed Compositional Formula | Analyzed Composition (molar amount) | | | | | | | |
|---|---|---|---|---|---|---|---|---|---|
| | | Ba | Mg | Mn | Al | O | Na | K | F |
| Fluorescent Material A-8 | $Ba_{1.0}Mg_{0.5}Mn_{0.5}Al_{10}O_{17}$ | 0.99 | 0.47 | 0.47 | 10.00 | 17.27 | 0.00 | — | 0.08 |
| Fluorescent Material A-9 | $Ba_{1.0}Mg_{0.9}Mn_{0.1}Al_{10}O_{17}$ | 0.98 | 0.87 | 0.09 | 10.00 | 17.23 | 0.03 | — | 0.07 |
| Fluorescent Material A-10 | $Ba_{1.0}Mg_{0.8}Mn_{0.2}Al_{10}O_{17}$ | 0.98 | 0.79 | 0.19 | 10.00 | 17.10 | 0.03 | — | 0.06 |

As shown in Table 2, the fluorescent materials A-1 to A-5 had compositions represented by formula (I) where the compositional ratio, the subscript b, of Mg is a number satisfying $0.0 \leq b \leq 0.7$ and the compositional ratio, the subscript c, of Mn is a number satisfying $0.3 \leq c \leq 0.7$. In addition, as shown in Table 1, the fluorescent materials A-1 to A-5 had an average particle diameter falling within a range of 10.0 µm to 30.0 µm. The relative emission intensity of the fluorescent materials A-1 to A-5 was more than 100%, and the reflection ratio thereof to light at 450 nm was less than 84%, specifically less than 82% and was low. From the results, the reflection ratio of the fluorescent materials A-1 to A-5 to light at 450 nm was small, and the fluorescent materials adsorbed the light at 450 nm relatively highly and could have a large relative emission intensity. In addition, the half value width of the emission spectrum of the fluorescent materials A-1 to A-5 was less than 45 nm, specifically not more than 37 nm, and it is known that the half value width thereof is narrower than that of the fluorescent materials B, C and D.

As shown in Table 2, the fluorescent materials A-6, A-9 and A-10 had compositions represented by formula (I) where the compositional ratio, the subscript b, of Mg is larger than 0.7 and is not a number satisfying $0.0 \leq b \leq 0.7$. Similarly, the compositional ratio, the subscript c, of Mn is smaller than 0.3 and is not a number satisfying $0.3 \leq c \leq 0.7$. The fluorescent materials A-7 and A-8 had composition represented by formula (I) where the compositional ratio, the subscript b, of Mg is a number satisfying $0.0 \leq b \leq 0.7$ and the compositional ratio, the subscript c, of Mn is a number satisfying $0.3 \leq c \leq 0.7$, but as shown in Table 1, the average particle diameter of these materials was less than 10.0 µm. The reflection ratio of the fluorescent materials A-6 to A-10 to light at 450 nm was more than 84%, and therefore it is confirmed that the reflection ratios of these materials are larger than those of the fluorescent materials A-1 to A-5. That is, the absorption of light at an excitation wavelength of 450 nm by these materials is small. The relative emission intensity values of the fluorescent materials A-6, A-7, A-9, and A-10 were smaller than those of the fluorescent materials A-1, A-2, A-4, and A-5.

As shown in Table 1, the full-width at half-maximum values of the fluorescent material B, the fluorescent material C and the fluorescent material D were more than 45 µm, and were broader than those of the fluorescent materials A-1 to A-10. As shown in FIG. 3, the fluorescent material B, the fluorescent material C and the fluorescent material D have broader full-width at half-maximum values than the fluorescent materials A-1 and A-5, and the emission peak wavelengths of the fluorescent material B and the fluorescent material C were on a longer wavelength side than those of the fluorescent material A-1 and the fluorescent material A-5.

Examples 1 to 5, Comparative Examples 1 to 8

A green fluorescent material containing a first fluorescent material 71, a red fluorescent material containing KSF as a second fluorescent material 72, and a silicone resin were mixed as dispersed to have a formulation ratio shown in Table 3, and defoamed to prepare a composition for a fluorescent member 50. In Table 3, the ratio of the green fluorescent material and the red fluorescent material to 100 parts by mass of the resin was expressed as "fluorescent material/resin (%)". In Table 3, the content (% by mass) of the green fluorescent material and the red fluorescent material relative to the total content 100% of the green fluorescent material and the red fluorescent material is shown. The formation ratio of the green fluorescent material and the red fluorescent material in the composition for the fluorescent member was so controlled that the mixed light to be emitted by the light emitting device to be produced could be around x of 0.26 and y of 0.22 (x=0.26, y=0.22) in the xy chromaticity coordinate prescribed in CIE 1931. A blue emitting LED (light emitting element) having an emission peak wavelength of 455 nm was mounted on the first lead 20, and then a composition for the fluorescent member 50 having the formulation ratio shown in Table 3 was charged on the blue emitting LED 10, and cured thereon to form the fluorescent member 50. In that manner, the light emitting device 100 shown in FIG. 1 was produced for Examples and Comparative Examples.

Measurement was made on each light emitting device as follows.

Relative NTSC Ratio

Using the emission spectral data of each light emitting device of Examples 1 to 5 and Comparative Examples 1 to 8 measured with a total flux measuring device using an integrating sphere, and the transmission curve data of arbitrary color filters, the NTSC ratio of each device shown in a liquid-crystal display device was calculated through simulation. As a standard, the NTSC ratio in displaying on a liquid display device as analyzed through the simulation using the emission spectral data of the light emitting device of Example 3 and the transition curve data of a color filter was referred to as 100%, and the relative NTSC ratio of each light emitting device as a relative value to that NTSC ratio was calculated. The results are shown in Table 4.

Regarding the light emitting device of Example 3, in the case of using a general color filter to give an NTSC ratio of 70% or so when applied to a light emitting device using the above-mentioned blue emitting LED and a YAG:Ce fluorescent material, the NTSC ratio in displaying on a liquid-crystal display device as analyzed through the simulation from the transmission curve data of the color filer and the emission spectral data of Example 3 was 103%. As a result of the simulation using the transmission curve data of a general color filter, the light emitting device of Example 3 realized a broad color reproducibility with an NTSC ratio of more than 100%. In Examples and Comparative Examples, the relative NTSC ratio was based on the NTSC ratio of the light emitting device having the broad color reproducibility.

Relative Luminous Flux

Using a total luminous flux measuring device with an integrating sphere, the luminous flux of the light emitting devices of Examples 1 to 5 and Comparative Examples 1 to 8 was measured. The luminous flux of the light emitting device of Example 3 was referred to as 100%, and the relative luminous flux of the light emitting devices of the other Examples and Comparative Examples was calculated. The results are shown in Table 4.

Chromaticity x, y

Through simulation using the emission spectral data of each light emitting device of Examples 1 to 5 and Comparative Examples 1 to 8 and the transmission curve data of a color filter, the chromaticity (x, y) of light in displaying on a liquid-crystal display device was calculated as the numerical values (x, y) on the xy chromaticity coordinate prescribed in CIE 1931. The results are shown in Table 4.

Emission Spectrum

Figure 4:
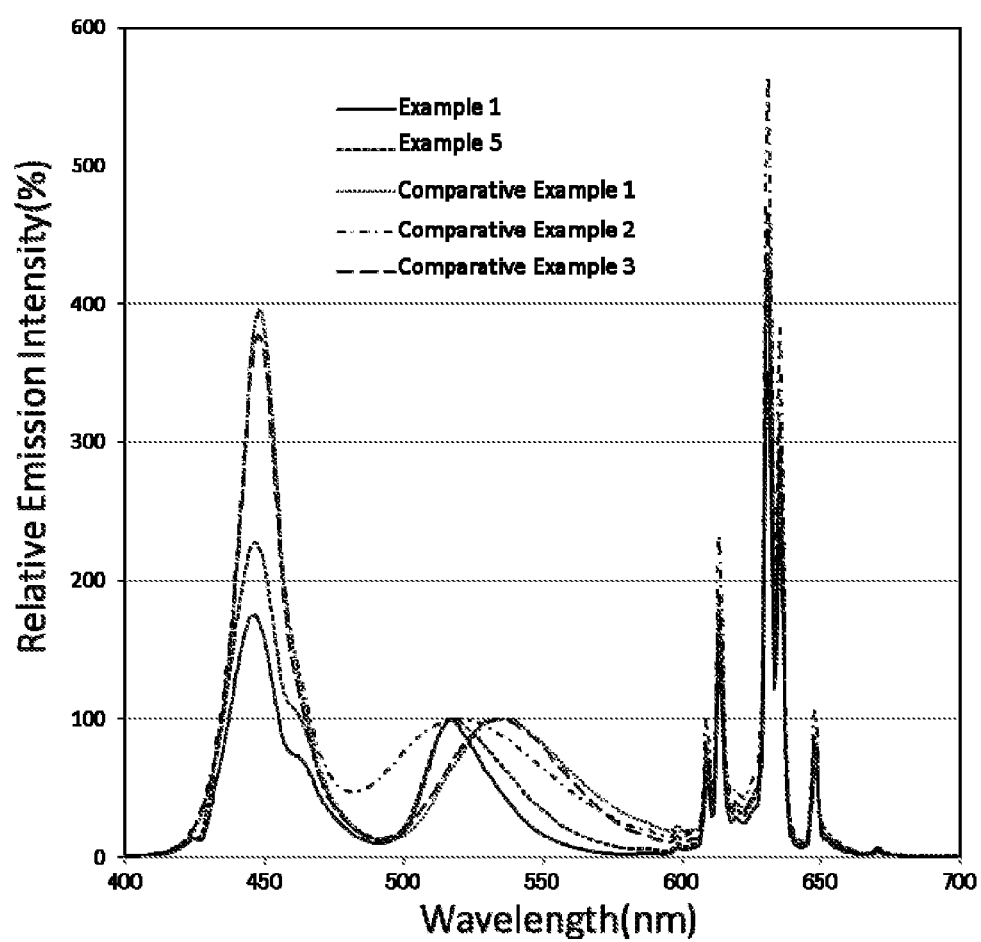
FIG. 4 includes emission spectra each showing the relative emission intensity to a wavelength of the light emitting device of Examples and Comparative Examples.

Using the same device as that for measurement of the relative luminous flux, the emission spectrum indicating the relative intensity to wavelength of each light emitting device of Examples 1 to 5 and Comparative Examples 1 to 8 was measured. The maximum emission intensity in a range of 510 nm or more and 525 nm or less in the emission spectrum of each light emitting device was referred to as 100%, and the emission intensity at 500 nm, 520 nm and 540 nm relative to that emission intensity was calculated. The results are shown in Table 4. In FIG. 4, the emission spectra of the light emitting devices of Examples 1 and 5 and the emission spectra of the light emitting devices of Comparative Examples 1 to 3 are shown.

TABLE 3

| | Green Fluorescent Material | | Red Fluorescent Material | Fluorescent Material/ Resin | Green Fluorescent Material (%) | Red Fluorescent Material (%) |
|---|---|---|---|---|---|---|
| Example 1 | Fluorescent Material A-1 | $Ba_{1.0}Mg_{0.5}Mn_{0.5}Al_{10}O_{17}$ | KSF ($K_2SiF_6$:Mn) | 135.7 | 93.1 | 6.9 |
| Example 2 | Fluorescent Material A-2 | $Ba_{1.0}Mg_{0.6}Mn_{0.4}Al_{10}O_{17}$ | | 167.9 | 94.4 | 5.6 |
| Example 3 | Fluorescent Material A-3 | $Ba_{1.0}Mg_{0.4}Mn_{0.6}Al_{10}O_{17}$ | | 183.8 | 95.1 | 4.9 |
| Example 4 | Fluorescent Material A-4 | $Ba_{1.0}Mg_{0.5}Mn_{0.5}Al_{10}O_{17}$ | | 165.6 | 93.1 | 6.9 |
| Example 5 | Fluorescent Material A-5 | $Ba_{1.0}Mn_{0.5}Al_{10}O_{17}$ | | 117.6 | 92.9 | 7.1 |
| Comparative Example 1 | Fluorescent Material B | $Si_{6-z}Al_zN_{8-z}$:Eu(z = 0.12) | | 13.5 | 34.4 | 65.6 |
| Comparative Example 2 | Fluorescent Material C | $Ca_8MgSi_4O_{16}Cl_2$:Eu | | 17.7 | 12.4 | 87.6 |
| Comparative Example 3 | Fluorescent Material D | $SrGa_2S_4$:Eu | | 13.7 | 5.3 | 94.7 |
| Comparative Example 4 | Fluorescent Material A-6 | $Ba_{1.0}Mg_{0.8}Mn_{0.2}Al_{10}O_{17}$ | | 185.0 | 98.0 | 2.0 |
| Comparative Example 5 | Fluorescent Material A-7 | $Ba_{1.0}Mg_{0.6}Mn_{0.4}Al_{10}O_{17}$ | | 128.5 | 94.3 | 5.7 |
| Comparative Example 6 | Fluorescent Material A-8 | $Ba_{1.0}Mg_{0.5}Mn_{0.5}Al_{10}O_{17}$ | | 107.1 | 93.2 | 6.8 |
| Comparative Example 7 | Fluorescent Material A-9 | $Ba_{1.0}Mg_{0.9}Mn_{0.1}Al_{10}O_{17}$ | | 185.0 | 96.0 | 4.0 |
| Comparative Example 8 | Fluorescent Material A-10 | $Ba_{1.0}Mg_{0.8}Mn_{0.2}Al_{10}O_{17}$ | | 185.0 | 98.0 | 2.0 |

TABLE 4

| | Light Emitting Device Green Fluorescent Material | | Relative NTSC Ratio (%) | Relative luminous Flux (%) | Chromaticity Coordinate | | Relative Emission Intensity (%) | | |
|---|---|---|---|---|---|---|---|---|---|
| | | | | | x | y | 500 nm | 520 nm | 540 nm |
| Example 1 | Fluorescent Material A-1 | $Ba_{1.0}Mg_{0.5}Mn_{0.5}Al_{10}O_{17}$ | 100.3 | 136.7 | 0.263 | 0.223 | 19.6 | 92.3 | 33.5 |
| Example 2 | Fluorescent Material A-2 | $Ba_{1.0}Mg_{0.6}Mn_{0.4}Al_{10}O_{17}$ | 100.3 | 127.6 | 0.262 | 0.223 | 20.4 | 92.0 | 32.5 |
| Example 3 | Fluorescent Material A-3 | $Ba_{1.0}Mg_{0.4}Mn_{0.6}Al_{10}O_{17}$ | 100.0 | 100.0 | 0.262 | 0.223 | 19.5 | 94.6 | 34.3 |
| Example 4 | Fluorescent Material A-4 | $Ba_{1.0}Mg_{0.5}Mn_{0.5}Al_{10}O_{17}$ | 100.2 | 155.2 | 0.262 | 0.223 | 19.9 | 93.1 | 33.3 |
| Example 5 | Fluorescent Material A-5 | $Ba_{1.0}Mn_{0.5}Al_{10}O_{17}$ | 97.3 | 145.3 | 0.262 | 0.223 | 22.5 | 98.3 | 54.0 |
| Comparative Example 1 | Fluorescent Material B | $Si_{6-z}Al_zN_{8-z}$:Eu(z = 0.12) | 87.7 | — | 0.263 | 0.223 | 16.1 | 71.9 | 98.8 |
| Comparative Example 2 | Fluorescent Material C | $Ca_8MgSi_4O_{16}Cl_2$:Eu | 88.7 | — | 0.262 | 0.223 | 76.2 | 99.9 | 80.4 |

TABLE 4-continued

| | Light Emitting Device Green Fluorescent Material | | Relative NTSC Ratio (%) | Relative luminous Flux (%) | Chromaticity Coordinate | | Relative Emission Intensity (%) | | |
|---|---|---|---|---|---|---|---|---|---|
| | | | | | x | y | 500 nm | 520 nm | 540 nm |
| Comparative Example 3 | Fluorescent Material D | $SrGa_2S_4$:Eu | 90.6 | — | 0.262 | 0.223 | 20.5 | 77.3 | 96.4 |
| Comparative Example 4 | Fluorescent Material A-6 | $Ba_{1.0}Mg_{0.8}Mn_{0.2}Al_{10}O_{17}$ | — | — | 0.212 | 0.166 | 22.2 | 89.2 | 30.5 |
| Comparative Example 5 | Fluorescent Material A-7 | $Ba_{1.0}Mg_{0.6}Mn_{0.4}Al_{10}O_{17}$ | 100.1 | 83.8 | 0.262 | 0.223 | 20.4 | 92.5 | 33.6 |
| Comparative Example 6 | Fluorescent Material A-8 | $Ba_{1.0}Mg_{0.5}Mn_{0.5}Al_{10}O_{17}$ | 99.9 | 92.4 | 0.262 | 0.223 | 20.0 | 93.0 | 34.3 |
| Comparative Example 7 | Fluorescent Material A-9 | $Ba_{1.0}Mg_{0.9}Mn_{0.1}Al_{10}O_{17}$ | — | — | 0.244 | 0.112 | 30.4 | 84.7 | 27.5 |
| Comparative Example 8 | Fluorescent Material A-10 | $Ba_{1.0}Mg_{0.8}Mn_{0.2}Al_{10}O_{17}$ | — | — | 0.199 | 0.135 | 23.4 | 87.2 | 29.1 |

As shown in Table 4, the relative NTSC ratio, calculated based on the value of Example 3, of the light emitting devices of Examples 1 to 5 is a value more than 100%, or is a value 97.3%, close to 100%, and it was confirmed that the range of the color reproducibility in these Examples is on the same level or is broader than the standard value.

The relative luminous flux, based on the luminous flux of the light emitting device of Example 3, of the light emitting devices of Examples 1 to 5 is more than 100%, and it was confirmed that the luminous flux in these Examples is large.

Regarding the numerical values of the xy chromaticity coordinate prescribed in CIE 1931 of the light emitting devices of Examples 1 to 5, x is 0.262 to 0.263 and y is 0.223, and it was confirmed that these devices emitted mixed light as configured.

Further, the relative emission intensity at 500 nm of the light emitting devices of Examples 1 to 5 is, as shown in Table 4, less than 25% in the case where the maximum emission intensity thereof in a range of 510 nm or more and 525 nm or less in the emission spectrum is referred to as 100%, the relative emission intensity at 520 nm thereof is more than 90% and the relative emission intensity at 540 nm thereof is less than 60%. From this, it is considered that the emission spectrum of the light emitting device has a narrow emission peak in the green wavelength region that is sandwiched between the blue and red wavelength regions and has significant influence on color reproducibility and the green wavelength region has little influence on light emission in the other wavelength regions, and consequently, such an emission peak confirmed enhanced color reproducibility of the light emitting device.

As shown in FIG. 4, the light emitting devices of Examples 1 and 5 have, in the emission spectrum thereof, a narrow emission peak in the wavelength range of 500 nm to 540 nm of a green region that is sandwiched between blue light and red light wavelength regions and has significant influence on color reproducibility, therefore reducing the influence on emission in the other wavelength regions and confirming color reproducibility in a broad range.

On the other hand, the light emitting device of Comparative Example 1 using a β-sialon fluorescent material as a green fluorescent material, the light emitting device of Comparative Example 2 using a chlorosilicate fluorescent material and the light emitting device of Comparative Example 3 using a thiogallate fluorescent material each have a low relative NTSC ratio, as shown in Table 4, that is, the range of color reproducibility of these devices is not broad. In addition, the light emitting devices of Comparative Example 1 and Comparative Example 3 each have a relative emission intensity at 520 nm of less than 85%, and a relative emission intensity at 540 nm of more than 60%, that is, the spectral width of the emission peak in the green region that has significant influence on color reproducibility of these devices is broad, and therefore would be strongly influenced by emission in the other wavelength regions. Consequently, these devices could hardly realize color reproduction in a broad range. Regarding the light emitting device of Comparative Example 2, the relative emission intensity at 500 nm thereof is more than 30%, and the relative emission intensity at 540 nm thereof is more than 75%, that is, like in Comparative Example 1, the device could hardly realize color reproduction in a broad range.

When the fluorescent materials A-6, A-9 and A-10 used in the light emitting devices of Comparative Examples 4, 7 and 8 are represented by formula (I), the compositional ratio, the subscript b, of Mg in these is more than 0.7 and is not a number satisfying 0.0≤b≤0.7, and the compositional ratio, the subscript c, of Mn therein is less than 0.3 and is not a number satisfying 0.3≤c≤0.7. The light emitting devices of Comparative Examples 4, 7 and 8 are described with reference to the numerical values in the xy chromaticity coordinate thereof as prescribed in CIE 1931. As shown in Table 4, the numerical values of these devices are significantly deviated from the preset values x=0.26 and y=0.22 in Examples 1 to 5, and it was confirmed that these devices could not realize desired mixed light.

The light emitting devices of Comparative Examples 5 and 6 use the fluorescent materials A-7 and A-8, respectively, each satisfying the composition represented by the compositional formula (I). However, the average particle diameter of the fluorescent materials A-7 and A-8 is, as shown in Table 1, less than 10.0 μm, and even though the relative NTSC ratio thereof was close to 100%, the relative flux value was smaller than that in Examples 1 to 5.

The light emitting device of an embodiment of the present disclosure can be used in a broad field of displays, backlight sources, general lightings, in-car lighting and others, using a light emitting diode as an excitation light source. The light emitting device of an embodiment of the present disclosure can realize color reproducibility in a broad range, and therefore can be favorably used for backlight sources in liquid-crystal display devices of monitors, smartphones and the like that are required to deeply and vividly reproduce colors of RGB.

The invention claimed is:

1. A light emitting device comprising:
a light emitting element having an emission peak wavelength in a range of 430 nm or more and 470 nm or less,
a first fluorescent material having a composition represented by formula (I), which has an emission peak wavelength in a range of 510 nm or more and 525 nm or less and has an average particle diameter in a range of 10.0 μm or more and 30.0 μm or less, $$X1_a Mg_b Mn_c Al_d O_{a+b+c+1.5d} \tag{I}$$

wherein X1 represents at least one element selected from the group consisting of Ba, Sr and Ca, and wherein a, b, c and d satisfy $0.5 \le a \le 1.0$, $0.0 \le b \le 0.7$, $0.3 \le c \le 0.7$, and $8.5 \le d \le 13.0$, and
a second fluorescent material having an emission peak wavelength in a range of 620 nm or more and 670 nm or less.

2. The light emitting device according to claim 1, wherein the first fluorescent material has a light reflection ratio at 450 nm of 84% or less.

3. The light emitting device according to claim 1, wherein the second fluorescent material is at least one selected from the group consisting of a fluoride fluorescent material, a magnesium fluorogermanate fluorescent material, a nitride fluorescent material and a sulfide fluorescent material.

4. The light emitting device according to claim 1, wherein the second fluorescent material is at least one selected from the group consisting of fluorescent materials having compositions represented by the following formulae (IIa) to (IIe):

$$K_2(Si,Ge,Ti)F_6:Mn \tag{IIa}$$

$$3.5MgO \cdot 0.5MgF_2 \cdot GeO_2:Mn \tag{IIb}$$

$$(Sr,Ca)AlSiN_3:Eu \tag{IIc}$$

$$(Sr,Ca)LiAl_3N_4:Eu \tag{IId}$$

$$(Ca,Sr)S:Eu \tag{IIe}$$

5. The light emitting device according to claim 1, wherein in formula (I), X1 contains Ba, and a satisfies $0.6 \le a \le 1.0$.

6. The light emitting device according to claim 1, wherein in formula (I), c satisfies $0.4 \le c \le 0.6$.

7. The light emitting device according to claim 1, wherein the average particle diameter of the first fluorescent material is in a range of 12.0 μm or more and 28.0 μm or less.

8. The light emitting device according to claim 1, which emits light with x falling within a range of 0.22 or more and 0.34 or less and y falling within a range of 0.16 or more and 0.40 or less in the xy chromaticity coordinate prescribe in CIE 1931.

* * * * *